United States Patent
Kawagoshi (10) Patent No.: US 7,940,113 B2
(45) Date of Patent: May 10, 2011

(54) FUSE TRIMMING CIRCUIT WITH HIGHER RELIABILITY

(75) Inventor: Hirokazu Kawagoshi, Ohtsu (JP)

(73) Assignee: Renesas Electronics Corporation, Kanagwa (JP)

( * ) Notice: Subject to any disclaimer, the term of this patent is extended or adjusted under 35 U.S.C. 154(b) by 792 days.

(21) Appl. No.: 11/401,874

(22) Filed: Apr. 12, 2006

(65) Prior Publication Data

US 2006/0227126 A1    Oct. 12, 2006

(30) Foreign Application Priority Data

Apr. 12, 2005   (JP) .................. 2005-114367

(51) Int. Cl.
  *H01H 37/76* (2006.01)
  *H01H 85/00* (2006.01)
(52) U.S. Cl. ...................................... 327/525
(58) Field of Classification Search .......... 327/525–526; 365/225.7
  See application file for complete search history.

(56) References Cited

U.S. PATENT DOCUMENTS

| | | | | |
|---|---|---|---|---|
| 6,054,893 | A * | 4/2000 | Singh | 327/525 |
| 6,762,918 | B2 * | 7/2004 | Voldman | 361/91.1 |
| 6,943,616 | B2 * | 9/2005 | Ogawa et al. | 327/538 |
| 7,319,267 | B2 * | 1/2008 | Uematsu et al. | 257/685 |
| 2002/0003483 | A1 * | 1/2002 | Hashimoto et al. | 341/121 |
| 2005/0030688 | A1 * | 2/2005 | Sakihama et al. | 361/91.1 |

FOREIGN PATENT DOCUMENTS

| | | |
|---|---|---|
| JP | 08-274266 | 10/1996 |
| JP | 2000-133778 | 5/2000 |
| JP | 2000-236022 | 8/2000 |

OTHER PUBLICATIONS

Text of the First Chinese Office Action issued Feb. 29, 2008 in Chinese Application No. 200610073519.8.

* cited by examiner

*Primary Examiner* — Quan Tra
(74) *Attorney, Agent, or Firm* — Young & Thompson (57) ABSTRACT

A fuse trimming circuit includes trimming pads, a fuse resistance, an input circuit and current limit units. The fuse resistance is configured to be connected to the trimming pads and blown out by a trimming current which flows through the trimming pads. The input circuit is configured to output one of a first potential and a second potential based on whether or not the fuse resistance is blown out. The current limit units are configured to be provided on paths from one of the trimming pads through the fuse resistance to at least one of a first power line feeding the first potential and a second power line feeding said second potential, and paths from another of the trimming pads through the fuse resistance to said at least one of the first power line and the second power line.

20 Claims, 6 Drawing Sheets

FUSE TRIMMING CIRCUIT WITH HIGHER RELIABILITY

BACKGROUND OF THE INVENTION

1. Field of the Invention

The present invention relates to a fuse trimming circuit.

2. Description of the Related Art

Figure 1:
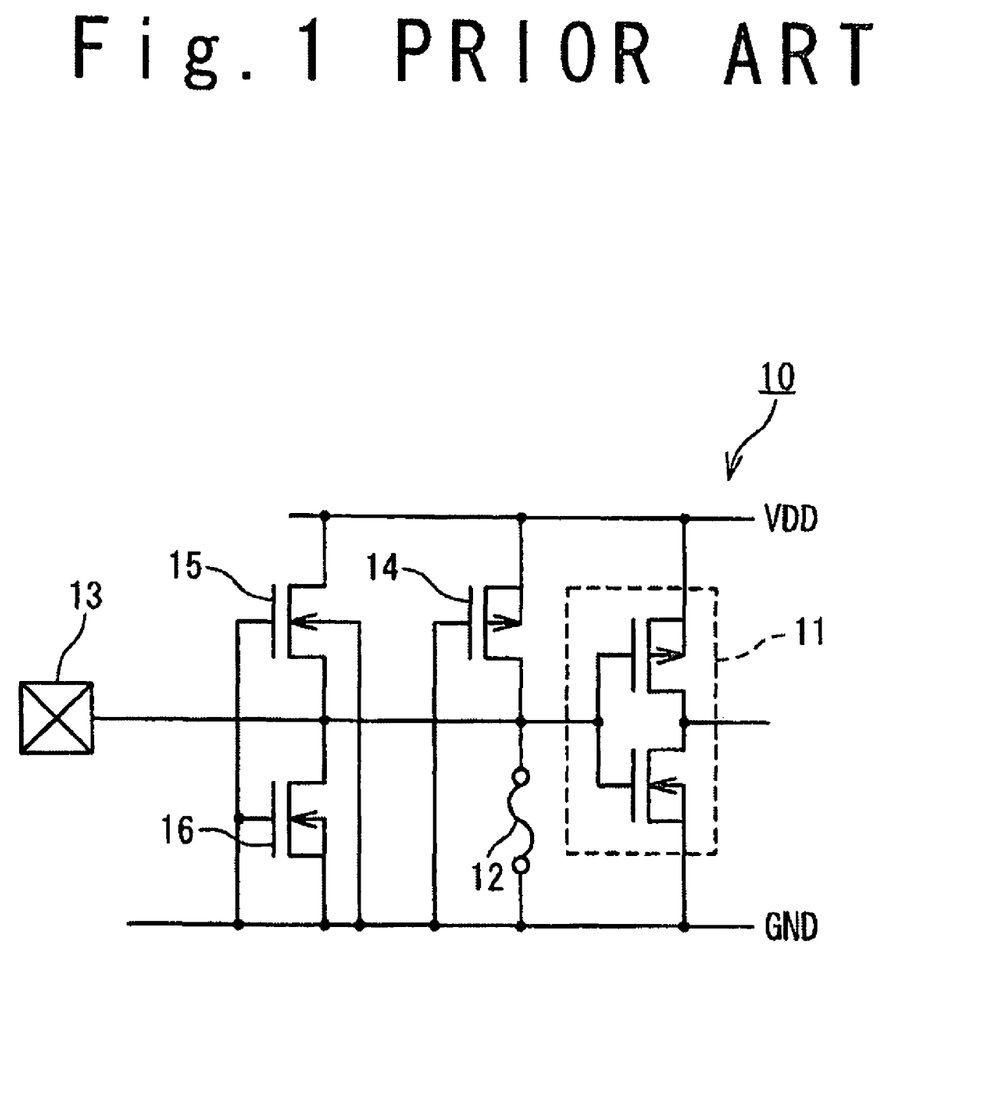
FIG. 1 is a circuit diagram showing a conventional fuse trimming circuit.

In a semiconductor integrated circuit (IC), a fuse trimming circuit is used to improve output accuracy of internal circuits (e.g. Japanese Laid-Open Patent Application JP-P2000-133778A). FIG. 1 is a circuit diagram showing a conventional fuse trimming circuit. A fuse trimming circuit 10 has a CMOS (complementary metal-oxide semiconductor) input circuit 11, a fuse resistance 12, a trimming pad 13, a P-channel MOS transistor 14, and N-channel MOS transistors 15 and 16. The fuse resistance 12 can be blown out by application of voltage or current and pulls down the potential level at an input end of the CMOS input circuit 11 to a ground potential GND in the connection state. To the trimming pad 13, voltage or current for blowing out the fuse resistance 12 is supplied. The P-channel MOS transistor 14 pulls up the potential level at the input end of the CMOS input circuit 11 to supply potential VDD. The N-channel MOS transistors 15 and 16 is used for electrostatic protection.

The fuse resistance 12 is connected to the input end of the CMOS input circuit 11 at one end thereof and connected to a ground line GND at the other end thereof. The trimming pad 13 is connected to one end of the fuse resistance 12. The MOS transistor 14 is connected to the power line VDD at a source thereof, connected to the input end of the CMOS input circuit 11 at a drain thereof and connected to the ground line GND at a gate thereof. The MOS transistor 15 is connected to the power line VDD at a drain thereof, connected to the input end of the CMOS input circuit 11 at a source thereof and connected to the ground line GND at a gate thereof. The MOS transistor 16 is connected to the input end of the CMOS input circuit 11 at a drain thereof and connected to the ground line GND at source and gate thereof.

Since the fuse resistance 12 is not blown out in the fuse trimming circuit 10 when trimming is unnecessary, the input end of the CMOS input circuit 11 is fixed at the "L" level (GND potential). Since the fuse resistance 12 is blown out by supplying a predetermined voltage or current to the trimming pad 13 when trimming is necessary, the input end of the CMOS input circuit 11 is fixed at the "H" level (VDD potential).

In conjunction with the above description, Japanese Laid-Open Patent Application JP-P2000-236022A discloses a fuse trimming circuit. This fuse trimming circuit includes a pad terminal, a fuse resistance, a dividing resistance, a protection resistance, a protection NMOS transistor, a pulling-up transistor and an input circuit. The pad terminal is provided on a p-type semiconductor substrate and executes a trimming. The fuse resistance is connected to the pad terminal at one end thereof, and can be blown out. The dividing resistance is connected between another end of the fuse resistance and a ground line. The protection resistance is connected to the pad terminal at one end thereof. The protection NMOS transistor is connected to another end of the protection resistance at a drain thereof, connected to a ground at a source thereof and connected to a connection point between the fuse resistance and the dividing resistance at a gate thereof. The pulling-up transistor is connected to the protection resistance and is hung on a supply line for determining a potential level The input circuit is connected to the protection resistance at a gate thereof.

We have now discovered the facts as described below. In a display device for portable information appliances such as portable phones and personal digital assistants (PDA), when a circuit for driving a display panel is formed of an integrated circuit, a power supply circuit is generally installed in the IC chip. The power supply circuit is composed of a step-up circuit and a voltage regulator circuit. In the voltage regulator circuit including the power supply circuit, there has been demanded the accuracy of an output voltage of ±3% or within it. To meet the demand, an output of a reference voltage generation circuit composed of a band gap reference circuit (BGR) contained in the voltage regulator circuit is trimmed by using a fuse trimming circuit, thereby obtaining the output of the reference voltage generation circuit with high accuracy.

The IC chip for driving the display panel can be mounted on the display panel according to the chip on glass (COG) technology. The IC chip for the COG mounting is generally formed in the state where a gold bump is exposed on an input/output pad or a power supply pad. The IC chip is directly COG mounted in the state where the gold bump is exposed. For this reason, electrostatic discharge (ESD) surge could be applied to the gold bump exposed after the IC chip is mounted.

When the fuse trimming circuit 10 is applied to the above-mentioned band gap reference circuit of the IC chip and the IC chip is used for COG mounting, the below-mentioned problem occurs. In this case, the gold bump is also exposed on the trimming pad 13 of the fuse trimming circuit 10 and the IC chip is directly COG mounted with this gold bump being exposed. Trimming is performed in a wafer (a wafer state). The IC chip, in which the fuse resistance 12 is not blown out in the case that the trimming is unnecessary, is mounted. In the situation that the power line VDD and the ground line GND are connected to the supply potential VDD and the ground potential GND, respectively, after the IC chip is mounted, when ESD surge is applied to the gold bump exposed on the trimming pad 13 and an ESD surge current flows to the power line VDD and/or the ground line GND through the fuse resistance 12, there is a possibility that the fuse resistance 12 could be blown out depending on the dimension of the ESD surge and duration time.

SUMMARY OF THE INVENTION

In order to achieve an aspect of the present invention, the present invention provides a fuse trimming circuit comprising: trimming pads; a fuse resistance configured to be connected to the trimming pads and blown out by a trimming current which flows through the trimming pads; an input circuit configured to output one of a first potential and a second potential based on whether or not the fuse resistance is blown out; and current limit units configured to be provided on paths from one of the trimming pads through the fuse resistance to at least one of a first power line feeding the first potential and a second power line feeding the second potential, and paths from another of the trimming pads through the fuse resistance to the at least one of the first power line and the second power line.

In the present invention, since current limit means are provided in the paths where the ESD surge current flows from the trimming pads to the first power line and the second power line via a fuse resistance. Therefore, the fuse trimming circuit can prevent the blowing-out of the fuse resistance due to the application of the ESD surge to the trimming pads.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 2:
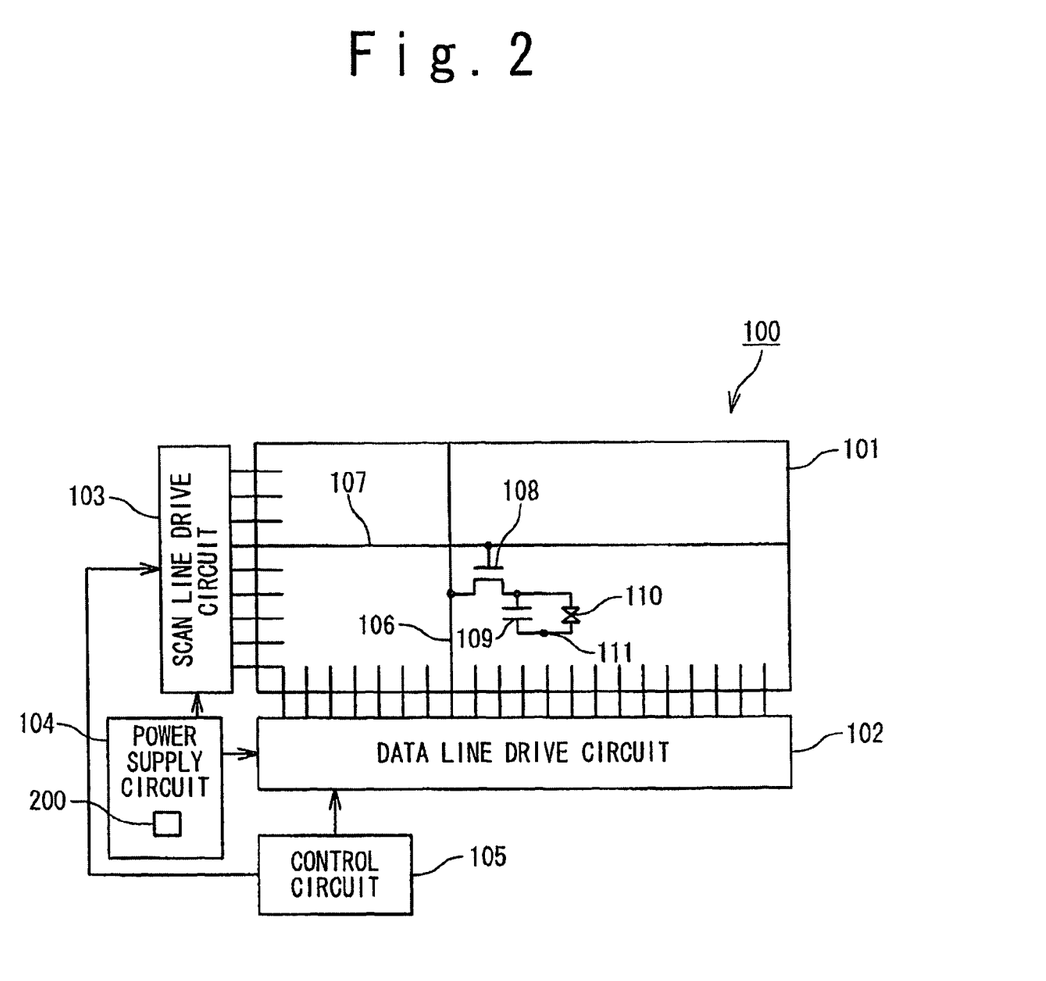
FIG. 2 is a block diagram showing a configuration of a liquid crystal display device using a fuse trimming circuit of the present invention.

Embodiments of a fuse trimming circuit according to the present invention will be described below with reference to the attached drawings. Here, a liquid crystal display device as a display device using the fuse trimming circuit of the present invention will be described. FIG. 2 is a block diagram showing a configuration of the liquid crystal display device 100 using the fuse trimming circuit of the present invention. For example, the liquid crystal display device 100 is used as a display device for portable information appliances such as portable phones and personal digital assistants. The liquid crystal display device 100 includes a liquid crystal display panel 101, a data line drive circuit 102, a scan line drive circuit 103, a power supply circuit 104 and a control circuit 105.

The liquid crystal display panel 101 includes data lines 106 and scan lines 107. The data lines 106 are arranged in the horizontal direction in the figure and extend in the vertical direction. The scan lines 107 are arranged in the vertical direction in the figure and extend in the horizontal direction. Each pixel is composed of a TFT 108, a pixel capacitance 109 and a liquid crystal element 110. A gate terminal of the TFT 108 is connected to the scan line 107 and a source (drain) terminal of the TFT 108 is connected to the data line 106. The drain (source) terminal of the TFT 108 is connected to a pixel capacitance 109 and a liquid crystal element 110, respectively. A terminal 111 of the pixel capacitance 109 and the liquid crystal element 110, which is not connected to the TFT 108, is connected to a common electrode not shown, for example.

The data line drive circuit 102 outputs a signal voltage based on display data to drive the data lines 106. The scan line drive circuit 103 outputs a selection/non-selection voltage of the TFT 108 to drive the scan lines 107. The control circuit 105 controls the drive timing by the scan line drive circuit 103 and the data line drive circuit 102. The power supply circuit 104 generates the signal voltage to be outputted from the data line drive circuit 102 and supplies it to the data line drive circuit 102. The power supply circuit 104 also generates the selection/non-selection voltage to be outputted from the scan line drive circuit 103 and supplies it to the scan line drive circuit 103. The power supply circuit 104 includes a reference voltage generation circuit 200 therein.

The data line drive circuit 102 and/or the scan line drive circuit 103 and the power supply circuit 104 are configured to be a semiconductor integrated circuit (hereinafter referred to as IC) as one chip. That is, the IC of one chip includes one of (the data line drive circuit 102+the power supply circuit 104), (the scan line drive circuit 103+the power supply circuit 104), and (the data line drive circuit 102+the scan line drive circuit 103+the power supply circuit 104). The control circuit 105 may be installed in this IC chip. This IC chip is COG mounted on a glass substrate of the liquid crystal display panel 101.

Figure 3:
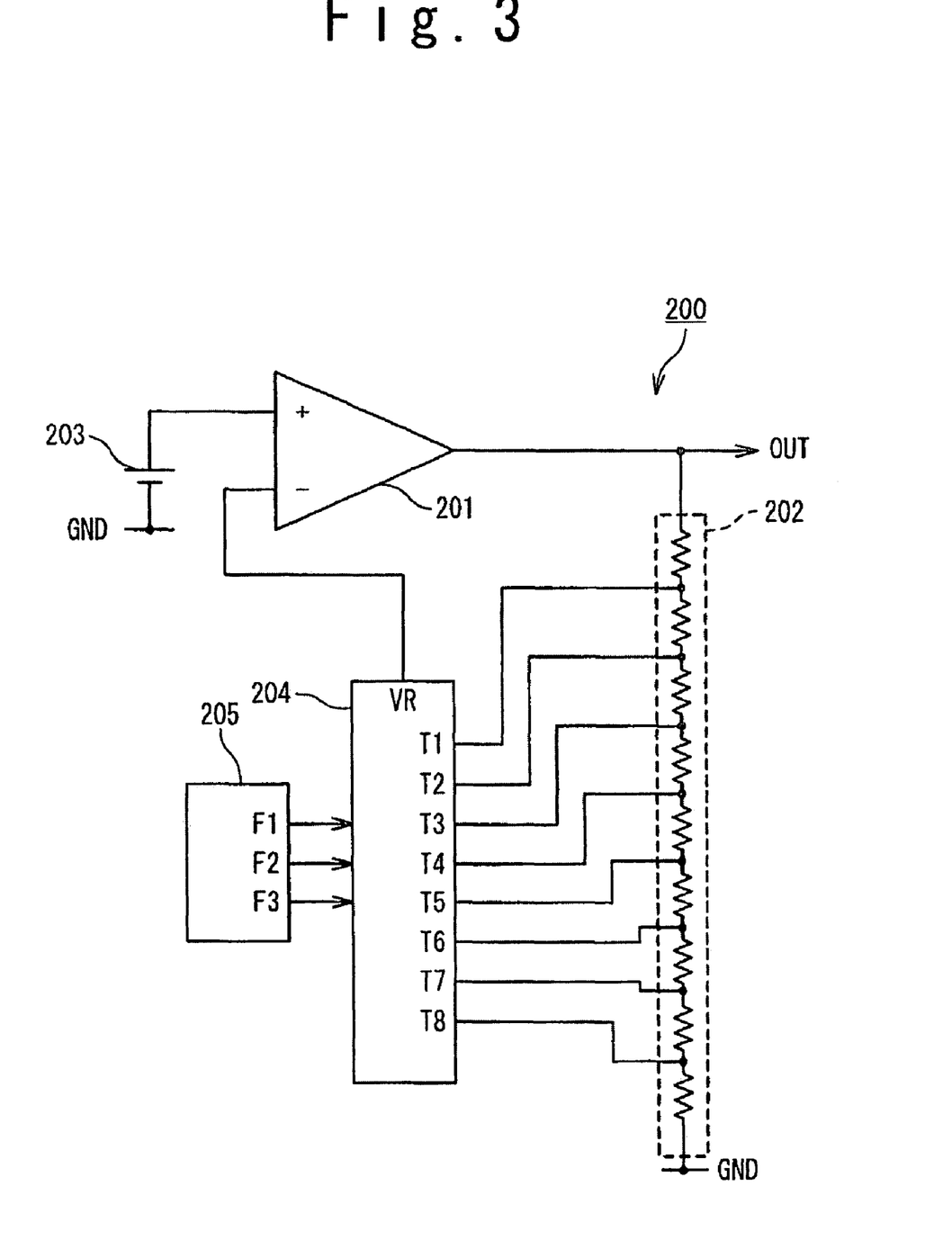
FIG. 3 is a block diagram showing the configuration of a reference voltage generation circuit shown in FIG. 2.

Next, the reference voltage generation circuit 200 will be described below. FIG. 3 is a block diagram showing the configuration of the reference voltage generation circuit 200 shown in FIG. 2. The reference voltage generation circuit 200 includes an amplifier 201, a voltage dividing circuit 202, a band gap reference circuit 203, a selector 204 and a fuse trimming circuit 205. The fuse trimming circuit 205 is composed of, for example, three fuse trimming units. Each of the three fuse trimming units generates one bit signal determined based on whether or not a fuse is cut. Then, the fuse trimming circuit 205 feeds a three-bit signal to the selector 204. The selector 204 selects an output of one voltage division point from outputs of eight voltage division points of the voltage dividing circuit 202 based on the logic of the three-bit signal fed from the fuse trimming circuit 205. The selector 204 feeds the output to an (−) input terminal of the amplifier 201. An output from the band gap reference circuit 203 is fed to an (+) input terminal of the amplifier 201.

By the logic of the three-bit signal determined based on whether or nor the three fuses are cut using the fuse trimming circuit 205, the reference voltage generation circuit 200 can generate eight types of reference voltages and supply one of the eight types of reference voltage with high accuracy in the power supply circuit 104.

Figure 4:
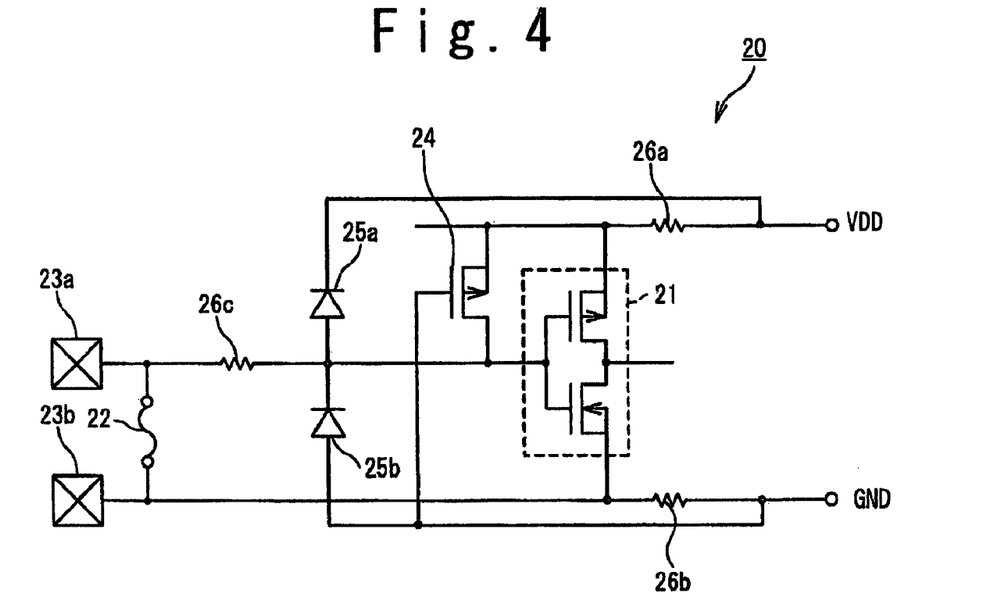
FIG. 4 is a circuit diagram showing a configuration of a fuse trimming circuit of a first embodiment of the present invention.

Next, a fuse trimming circuit 20 of a first embodiment, which can be used as the fuse trimming unit of the fuse trimming circuit 205, will be described below. FIG. 4 is a circuit diagram showing a configuration of the fuse trimming circuit 20 of the first embodiment of the present invention. The fuse trimming circuit 20 includes a CMOS input circuit 21, a fuse resistance 22, pads 23a and 23b, a P-channel MOS transistor 24, diodes 25a and 25b and resistances 26a, 26b and 26c.

The CMOS input circuit 21 as an input circuit is connected between the power line VDD as the first power line and the ground line GND as the second power line.

The fuse resistance 22 can switch the input potential level of the CMOS input circuit 21 by being blown out due to the application of voltage or current. In the non-blown-out state, the fuse resistance 22 pulls down the potential level of the input end of the CMOS input circuit 21 to the ground potential GND. Thus, the fuse resistance 22 is connected to the input end of the CMOS input circuit 21 at one end thereof and is connected to the ground line GND at another end thereof.

As trimming pads which receive the voltage or current for blowing out the fuse resistance 22, the pad 23*a* is connected to one end of the fuse resistance 22 and the pad 23*b* is connected to the other end of the fuse resistance 22.

Since the MOS transistor 24 pulls up the potential level of the input end of the CMOS input circuit 21 to the supply potential VDD in the blown-out state of the fuse resistance 22, the source of the MOS transistor 24 is connected to the power line VDD, the drain thereof is connected to the input end of the CMOS input circuit 21 and the gate thereof is connected to the ground line GND.

The diodes 25*a* and 25*b* are electrostatic protection elements, a cathode of the diode 25*a* is connected to the power line VDD, an anode of the diode 25*a* and a cathode of the diode 25*b* are connected to the input end of the CMOS input circuit 21 and an anode of the diode 25*b* is connected to the ground line GND.

The resistances 26*a*, 26*b* and 26*c* are high resistance elements as current limit means (current limit units) and provided in each of below-mentioned first to fourth paths referring to FIG. 5.

Figure 5:
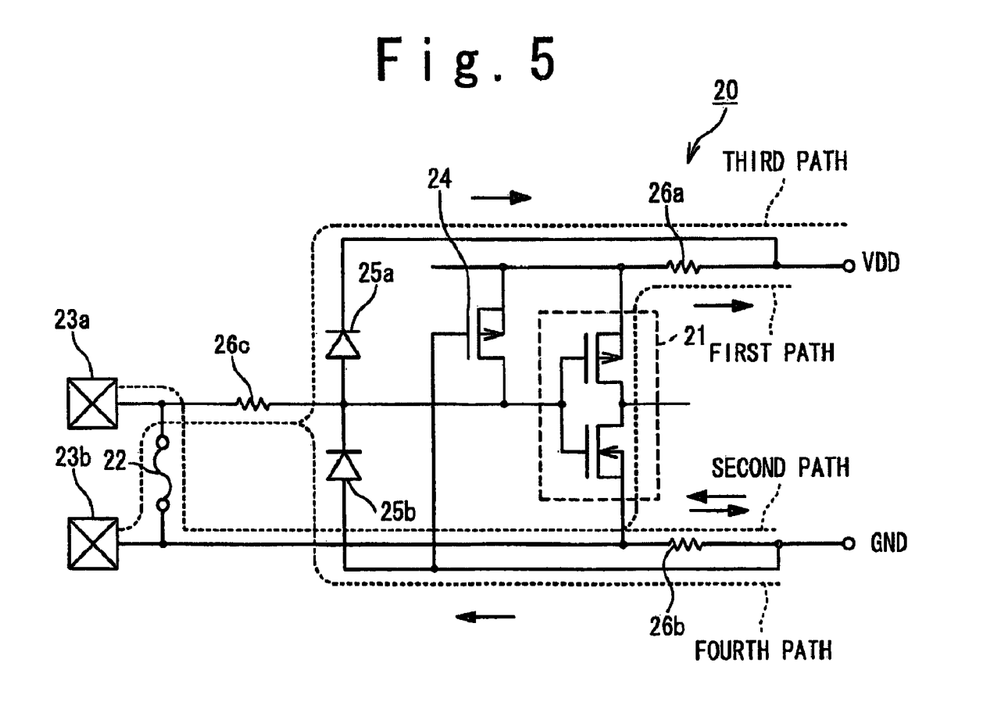
FIG. 5 is a circuit diagram showing paths of ESD surge currents flowing via the fuse resistance in the fuse trimming circuit shown in FIG. 4.

FIG. 5 is a circuit diagram showing paths of ESD surge currents flowing via the fuse resistance 22 in the fuse trimming circuit 20 shown in FIG. 4. The first path is a path through which a positive ESD surge current flows from the pad 23*a* to the power line VDD via the fuse resistance 22. The second path is a path through which a positive or negative ESD surge current flows from the pad 23*a* to the ground line GND via the fuse resistance 22. The third path is a path through which the positive ESD surge current flows from the pad 23*b* to the power line VDD via the fuse resistance 22. The fourth path is a path through which the negative ESD surge current flows from the pad 23*b* to the ground line GND via the fuse resistance 22. The resistance 26*a* is inserted into and connected to the first path between the VDD side input end of the CMOS input circuit 21 and the source of the MOS transistor 24 and the power line VDD. The resistance 26*b* is inserted into and connected to the second path between the GND side input end of the CMOS input circuit 21 and the other end of the fuse resistance 22 and the ground line GND. The resistance 26*c* is inserted into and connected to a common path of the third path and the fourth path between one end of the fuse resistance 22 and a connection point between the diodes 25*a* and 25*b*.

Resistance values R1, R2 and R3 of the resistances 26*a*, 26*b* and 26*c* are determined by the applied voltage of the ESD surge and a blowing-out current (a trimming current) of the fuse resistance 22. For example, when the applied voltage of the ESD surge is 2000 V and the blowing-out current of the fuse resistance 22 is 200 mA, the resistance values are set to be 10 kΩ or more. Since the resistances 26*a*, 26*b* and 26*c* are not provided in the path of the current flowing through the fuse resistance 22 when the trimming is performed, the resistances 26*a*, 26*b* and 26*c* never limit the blowing-out current of the fuse resistance 22.

Since the fuse resistance 22 is not blown out in the fuse trimming circuit 20 when the trimming is unnecessary, the input end of the CMOS input circuit 21 is fixed at the "L" level (ground potential). After the IC with the fuse trimming circuit 20 is COG mounted in the state where the fuse resistance 22 is not blown out, when the power line VDD and the ground line GND are connected to the supply potential VDD and the ground potential GND, respectively, even if the ESD surge current flows from the pads 23*a* and 23*b* to the power line VDD and the ground line GND through the fuse resistance 22, the resistances 26*a*, 26*b* and 26*c* acts as the current limit means which limit the ESD surge current. Accordingly, there is no possibility that the fuse resistance 22 will be blown out. For example, when the resistance values R1, R2 and R3 are set to be 100 kΩ, the ESD surge current flowing through the fuse resistance 22 becomes about 20 mA when the applied voltage of ESD surge is 2000 V. Assuming that the blowing-out current of the fuse resistance 22 is 200 mA, there is no possibility that the fuse resistance 22 will be blown out.

Since the fuse resistance 22 is blown out by feeding a predetermined voltage or current between the pads 23*a* and 23*b* when the trimming is necessary, the input end of the CMOS input circuit 21 is fixed at the "H" level (VDD potential).

Here, the trimming is carried out in the situation that the power line VDD is connected to the supply potential VDD (or the ground potential GND), and the ground line GND is connected to the ground potential GND.

When the trimming is performed, since the trimming voltage is applied to the input end of the CMOS input circuit 11 of the conventional fuse trimming circuit 10 shown in FIG. 1, the CMOS input circuit 11 needs to be formed of a high voltage circuit. However, since only the supply voltage VDD and forward voltage VF of the diode 25*a* are applied to the input end of the CMOS input circuit 21 of the fuse trimming circuit 20 by the resistance 26*c* and the diode 25*a*, the CMOS input circuit 21 can be formed of a low voltage circuit. Furthermore, since only the potential of the ground line GND is applied to the gate of the MOS transistor 24, the MOS transistor 24 can be also formed at low voltage.

Figure 6:
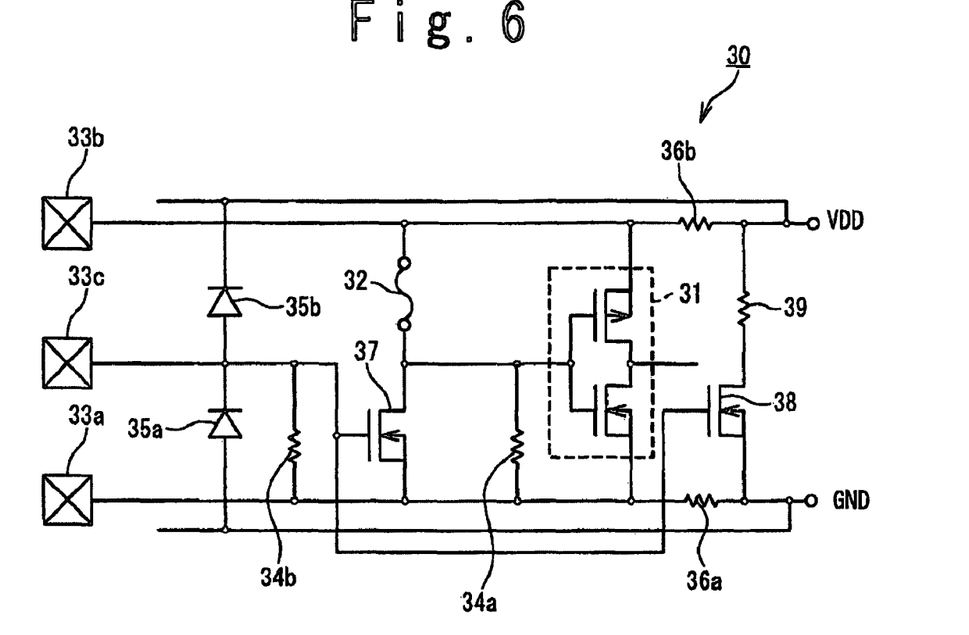
FIG. 6 is a circuit diagram showing a configuration of a fuse trimming circuit of a second embodiment of the present invention.

Next, a fuse trimming circuit 30 of a second embodiment, which can be used as the fuse trimming unit of the fuse trimming circuit 205, will be described below. FIG. 6 is a circuit diagram showing a configuration of the fuse trimming circuit 30 of the second embodiment of the present invention. The fuse trimming circuit 30 includes a CMOS input circuit 31, a fuse resistance 32, pads 33*a*, 33*b* and 33*c*, resistances 34*a*, 34*b*, 36*a*, 36*b* and 39, diodes 35*a* and 35*b*, and N-channel MOS transistors 37 and 38.

The CMOS input circuit 31 as an input circuit is connected between the ground line GND as the first power line and the power line VDD as the second power line.

The fuse resistance 32 can switch the input potential level of the CMOS input circuit 31 by being blown out due to the application of voltage or current. In the non-blown-out state, the fuse resistance 32 pulls up the potential level of the input end of the CMOS input circuit 31 to the power potential VDD. Thus, the fuse resistance 32 is connected to the input end of the CMOS input circuit 31 at one end thereof and is connected to the power line VDD at another end thereof.

The pads 33*a* and 33*b* are trimming pads which receive the voltage or current for blowing out the fuse resistance 32, the pad 33*a* is connected to one end of the fuse resistance 32 and the pad 33*b* is connected to the other end of the fuse resistance 32.

Since the potential level of the input end of the CMOS input circuit 31 is pulled down in the state where the fuse resistance 32 is blown out, the resistance 34*a* is connected to the input end of the CMOS input circuit 31 and the ground line GND. Since the gate potential level of the MOS transistor 37 is pulled down to the ground potential GND in the state where there exists no input to the pad 33*c*, the resistance 34*b* is connected between the gate of the MOS transistor 37 and the ground line GND.

To connect the pad 33*a* to one end of the fuse resistance 32 only when the trimming is performed, the source of the MOS transistor 37 is connected to the pad 33a and the drain of the MOS transistor 37 is connected to the one end of the fuse resistance 32. The source of the MOS transistor 37 is connected to the ground line GND. To control the MOS transistor 37 so as to be turned on only when the trimming is performed, the gate of the MOS transistor 37 is connected to the pad 33c as a control pad.

The diodes 35a and 35b are electrostatic protection elements, an anode of the diode 35a is connected to the ground line GND, a cathode of the diode 35a and the anode of the diode 35b are connected to the gate of the MOS transistor 37 and the cathode of the diode 35b is connected to the power line VDD.

Figure 7:
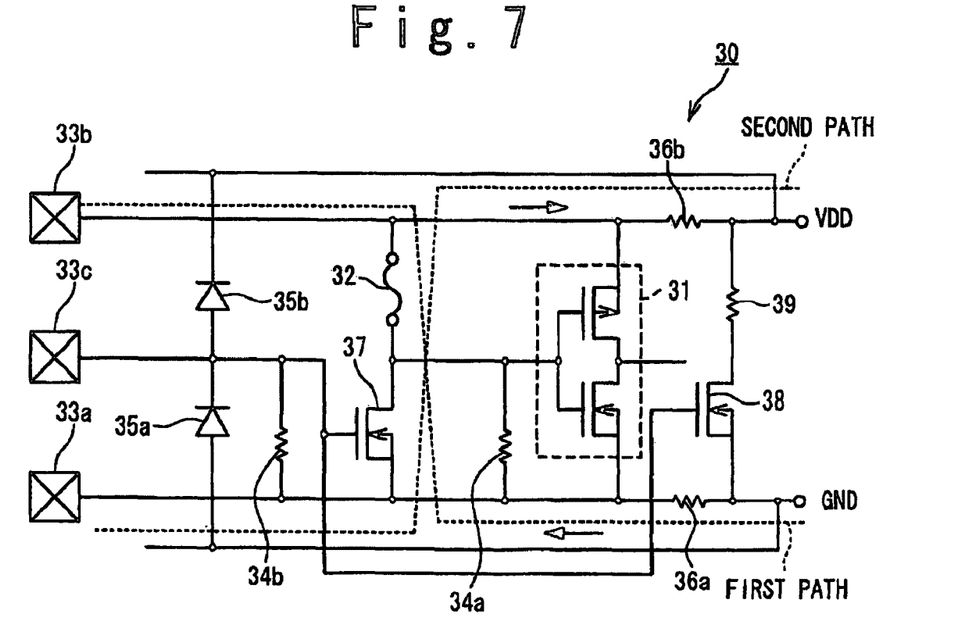
FIG. 7 is a circuit diagram showing paths of ESD surge currents flowing via the fuse resistance in the fuse trimming circuit shown in FIG. 6.

The resistances 36a and 36b are high resistance elements as current limit means (current limit units) and provided in each of below-mentioned first and second paths referring to FIG. 7. FIG. 7 is a circuit diagram showing paths of ESD surge currents flowing via the fuse resistance 32 in the fuse trimming circuit 30 shown in FIG. 6. The first path is a path through which a negative ESD surge current flows from the pad 33b to the ground line GND via the fuse resistance 32. The second path is a path through which the positive ESD surge current flows from the pad 33a to the power line VDD via the fuse resistance 32. The resistance 36a is inserted into and connected to the first path between GND side ends of the resistances 34a and 34b, the source of the MOS transistor 37 and the GND side input end of the CMOS input circuit 31, and the ground line GND. The resistance 36b is inserted into and connected to the second path between the other end of the fuse resistance 32 and the VDD side input end of the CMOS input circuit 31, and the power line VDD.

As in the resistances 26a and 26b of the fuse trimming circuit 20, resistance values R1 and R2 of the resistances 36a and 36b are determined by the applied voltage of the ESD surge and a blowing-out current (a trimming current) of the fuse resistance 32. Since the resistances 36a and 36b are not provided in the path of the current flowing through the fuse resistance 32 when the trimming is performed, the resistances 36a and 36b never limit the blowing-out current of the fuse resistance 32.

The MOS transistor 38 is connected to the ground line GND at the source thereof, connected to the power line VDD via the resistance 39 at the drain thereof and commonly connected to the gate of the MOS transistor 37 at the gate thereof. Therefore, the MOS transistor 38 is turned on by the voltage applied to the pad 33c only when the trimming is performed and high voltage is not applied to the power line VDD due to the divided voltage by the resistance 36b and 39. A resistance value R4 of the resistance 39 is determined by a ratio of the resistance value R4 to the resistance value R2 of the resistance 36b so as to put the voltage applied to the pad 33b into the potential level at which high voltage is not applied to the VDD.

Since the fuse resistance 32 is not blown out in the fuse trimming circuit 30 when trimming is unnecessary, the input end of the CMOS input circuit 31 is fixed at the "H" level (VDD potential). After the IC with the fuse trimming circuit 30 is COG mounted on the liquid crystal panel in the state where the fuse resistance 32 is not blown out, when the power line VDD and the ground line GND are connected to the supply potential VDD and the ground potential GND, respectively, even if the ESD surge current flows from the pads 33a and 33b to the power line VDD and the ground line GND via the fuse resistance 32, the resistances 36a and 36b function as the current limit means which limit the ESD surge current. Thus, there is no possibility that the fuse resistance 32 will be blown out. By providing the MOS transistor 37 in the fuse trimming circuit 30, the number of paths through which the ESD surge current flows from the trimming pad to the power line VDD and the ground line GND through the fuse resistance becomes smaller than that in the fuse trimming circuit 20, and the ESD surge current flowing through the fuse resistance can be further limited in comparison with the fuse trimming circuit 20.

When trimming is necessary, since the fuse resistance 32 is blown out by feeding a control signal for controlling so as to turn on the MOS transistor 37 to the pad 33c and supplying a predetermined voltage or current between the pads 33a and 33b, the input end of the CMOS input circuit 31 is fixed at the "L" level (GND potential).

Since a trimming voltage is applied to the input end of the CMOS input circuit 11 in the conventional fuse trimming circuit 10 when the trimming is performed, the CMOS input circuit 11 needs to be formed of a high voltage circuit. However, since only the potential of the pad 33a, generally, the potential of the ground line GND is applied to the input end of the CMOS input circuit 31 in the fuse trimming circuit 30 by ON-control of the MOS transistor 37, the CMOS input circuit 31 can be formed of a low voltage circuit. Furthermore, since only the potential of the power line VDD or the ground line GND is applied to the gates of the MOS transistors 37 and 38 can be also formed for low voltage. The pad 33c goes into a non-signal (floating) state at all times other than the time of trimming. When the resistance 34b is not used, after the mounting of the IC chip, the pad 33c may be fixed to the ground potential by an inner circuit or an outer circuit of the IC.

Figure 8:
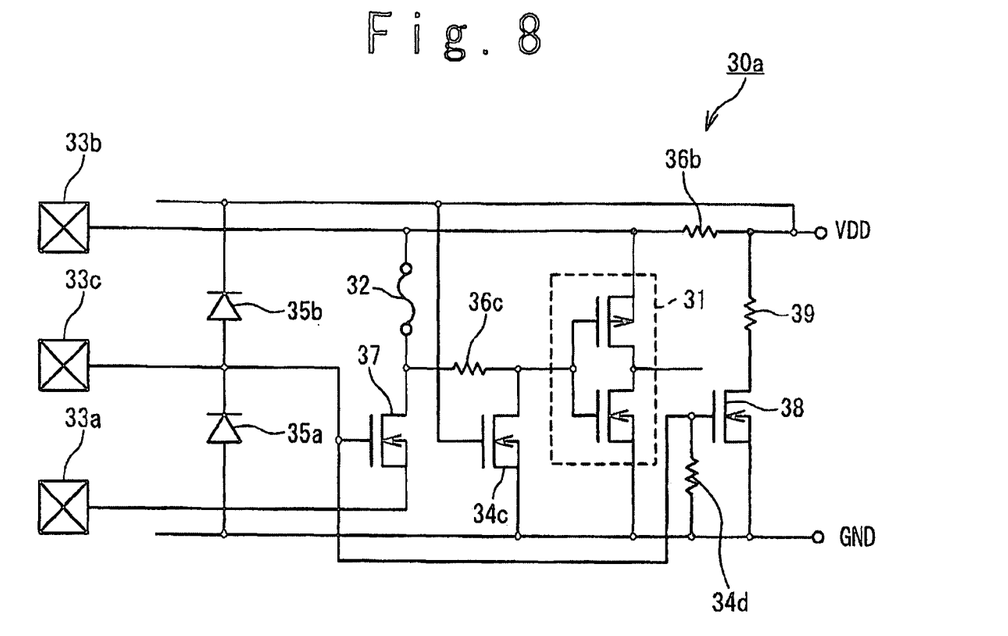
FIG. 8 is a circuit diagram showing a configuration of the fuse trimming circuit 30a of the third embodiment of the present invention.
Figure 9:
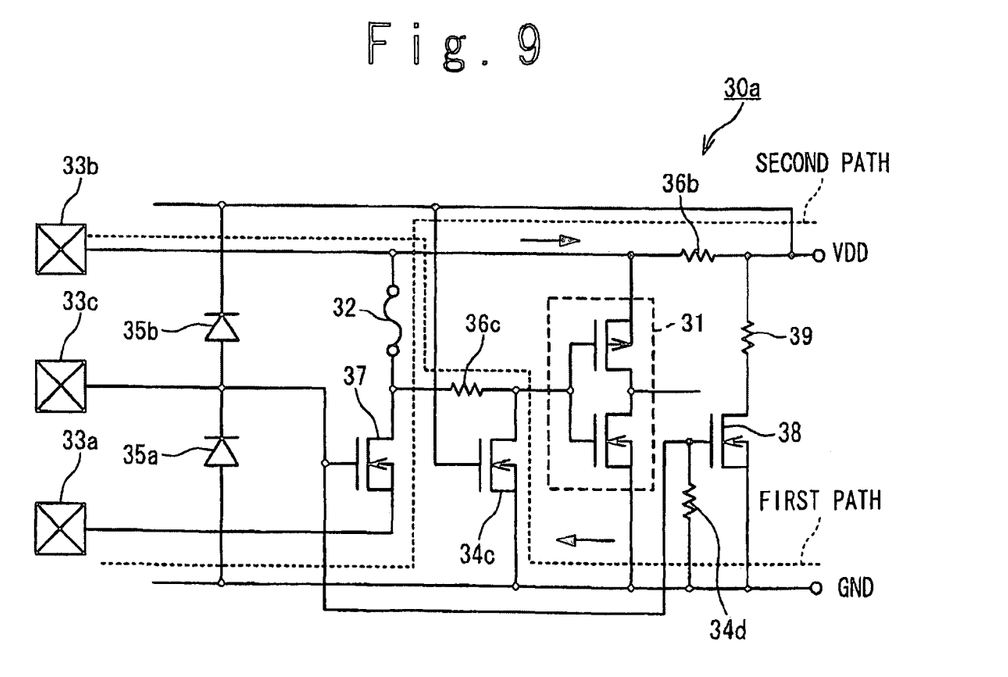
FIG. 9 is a circuit diagram showing paths of ESD surge currents flowing via the fuse resistance 32 in the fuse trimming circuit 30a shown in FIG. 8.

Next, a fuse trimming circuit 30a of a third embodiment, which can be used as the fuse trimming unit of the fuse trimming circuit 205, will be described below. FIG. 8 is a circuit diagram showing a configuration of the fuse trimming circuit 30a of the third embodiment of the present invention. A difference between the fuse trimming circuit 30a and the fuse trimming circuit 30 will be described referring to FIG. 8. The source of the MOS transistor 37 is connected to the ground line GND in the fuse trimming circuit 30, whereas the source of the MOS transistor 37 is not connected to the ground line GND in the fuse trimming circuit 30a. In this case, although it is unnecessary to connect a pull down resistance between the gate and the source of the MOS transistor 37, a pull down resistance 34d is connected between the gate and the source of the MOS transistor 38. In place of the resistance 34a, the MOS transistor 34c is connected. The MOS transistor 34c is connected to the ground line GND at the source thereof, connected to the input end of the CMOS input circuit 31 at the drain thereof and connected to the power line VDD at the gate thereof. FIG. 9 is a circuit diagram showing paths of ESD surge currents flowing via the fuse resistance 32 in the fuse trimming circuit 30a shown in FIG. 8. As the current limit means (current limit unit) in the first path, a resistance 36c, in place of the resistance 36a in the fuse trimming circuit 30, is inserted into and connected to the first path between one end of the fuse resistance 32 and the drain of the MOS transistor 34c. Even if a negative ESD surge current flows from the pad 33b to the first path, the resistance 36c functions as the current limit means for limiting the ESD surge current. Thus, there is no possibility that the fuse resistance 32 will be blown out. Since other operations of the fuse trimming circuit 30a are similar to those of the fuse trimming circuit 30, description thereof is omitted.

Although the diodes 25a, 25b, 35a and 35b are used as electrostatic protection elements in the above-mentioned embodiments, MOS transistors may be used as the electrostatic protection elements. Further, if necessary, other electrostatic protection elements other than the diodes 25a, 25b, 35a and 35b may be connected to necessary positions. Furthermore, although the MOS transistor 24 in the first embodiment and the MOS transistor 34c in the third embodiment are used as means of pulling up or pulling down the potential of the input end of the input circuit to the potential of the first power line, the MOS transistors may be replaced by resistance elements.

According to the present invention, it is possible to provide a fuse trimming circuit which can prevent the blowing-out of a fuse resistance due to the application of the ESD surge to the trimming pad by providing a current limit means in a path where the ESD surge current flows from the trimming pad to a first power line and a second power line via a fuse resistance.

It is apparent that the present invention is not limited to the above embodiment, that may be modified and changed without departing form the scope and spirit of the invention.

What is claimed is:

1. A fuse trimming circuit comprising:
   trimming pads;
   a fuse resistance configured to be connected to said trimming pads and blown out by a trimming current which flows through said trimming pads;
   an input circuit configured to output one of a first potential and a second potential based on whether or not said fuse resistance is blown out; and
   current limit units configured to be provided on paths from one of said trimming pads through said fuse resistance to at least one of a first power line feeding said first potential and a second power line feeding said second potential, and paths from another of said trimming pads through said fuse resistance to said at least one of the first power line and the second power line,
   wherein said input circuit includes:
   a first potential input terminal configured to be connected to said first power line, and
   a second potential input terminal configured to be connected to said second power line,
   wherein one of said current limit units is provided between said first potential input terminal and said first power line,
   a first electrostatic protection element configured to be connected directly between an input terminal and said first potential input terminal; and
   a second electrostatic protection element configured to be connected directly between said input terminal and said second potential input terminal,
   wherein said fuse resistance is connected to a second input terminal at one end, and connected to said second power line at another end.

2. The fuse trimming circuit according to claim 1,
   wherein said trimming pads include:
   a first pad configured to be connected to one end of said fuse resistance, and
   a second pad configured to be connected to another end of said fuse resistance,
   wherein said current limit units include:
   a first resistance configured to be inserted between a first potential input terminal of said input circuit and said first power line, and
   a second resistance configured to be inserted between the other end of said fuse resistance and a second potential input terminal of said input circuit, and said second power line.

3. The fuse trimming circuit according to claim 2, wherein said current limit units further include:
   a third resistance configured to be inserted between one end of said fuse resistance and a connection point of said first electrostatic protection element and said second electrostatic protection element.

4. The fuse trimming circuit according to claim 1, further comprising:
   a pulling element configured to be connected to an input terminal of said input circuit, and pull up or down a potential of said input terminal to said first potential,
   wherein said trimming pads include:
   a first pad configured to be connected to one end of said fuse resistance, and
   a second pad configured to be connected to another end of said fuse resistance,
   said fuse trimming circuit further comprising:
   a switch element configured to be inserted between said first pad and one end of said fuse resistance.

5. The fuse trimming circuit according to claim 4, wherein said current limit units include:
   a first resistance configured to be inserted between a first potential input terminal of said input circuit and said first power line, and
   a second resistance configured to be inserted between the other end of said fuse resistance and a second potential input terminal of said input circuit, and said second power line.

6. The fuse trimming circuit according to claim 4, wherein said switch element is not connected to said first power line at one end where said first pad is connected,
   wherein said current limit units include:
   a second resistance configured to be inserted between the other end of said fuse resistance and a second potential input terminal of said input circuit, and said second power line, and
   a third resistance configured to be connected between one end of said fuse resistance and one end of said pulling element where said input terminal is connected.

7. A display comprising:
   a display panel configured to include data lines and scan lines;
   a data line drive circuit configured to drive said data lines;
   a scan line drive circuit configured to drive said scan lines; and
   a power supply circuit configured to supply power to said data line drive and said scan line drive circuit, and include a trimming circuit,
   wherein said trimming circuit includes:
   trimming pads;
   a fuse resistance configured to be connected to said trimming pads and blown out by a trimming current which flows through said trimming pads;
   an input circuit configured to output one of a first potential and a second potential based on whether or not said fuse resistance is blown out; and
   current limit units configured to be provided on paths from one of said trimming pads through said fuse resistance to at least one of a first power line feeding said first potential and a second power line feeding said second potential, and paths from another of said trimming pads through said fuse resistance to said at least one of the first power line and the second power line,
   wherein said input circuit includes:
   a first potential input terminal configured to be connected to said first power line, and
   a second potential input terminal configured to be connected to said second power line,
   wherein one of said current limit units is provided between said first potential input terminal and said first power line,
   a first electrostatic protection element configured to be directly connected between said input terminal and said first potential input terminal; and a second electrostatic protection element configured to be directly connected between said input terminal and said second potential input terminal, wherein said fuse resistance is connected to said input terminal at one end, and connected to said second power line at another end.

8. The display according to claim 7, wherein said power supply circuit is configured to be a semiconductor integrated circuit as one chip where is COG mounted on a glass substrate of said display panel.

9. A method of operating a fuse trimming circuit, comprising:

(a) providing said fuse trimming circuit, wherein said fuse trimming circuit includes:

trimming pads;

a fuse resistance configured to be connected to said trimming pads and blown out by a trimming current which flows through said trimming pads;

an input circuit configured to output one of a first potential and a second potential based on whether or not said fuse resistance is blown out; and current limit units configured to be provided on paths from one of said trimming pads through said fuse resistance to at least one of a first power line feeding said first potential and a second power line feeding said second potential, and paths from another of said trimming pads through said fuse resistance to said at least one of the first power line and the second power line, wherein said input circuit includes:

a first potential input terminal configured to be connected to said first power line, and a second potential input terminal configured to be connected to said second power line, wherein one of said current limit units is provided between said first potential input terminal and said first power line, a first electrostatic protection element configured to be directly connected between said input terminal and said first potential input terminal; and a second electrostatic protection element configured to be directly connected between said input terminal and said second potential input terminal, wherein said fuse resistance is connected to said input terminal at one end, and connected to said second power line at another end; and (b) outputting one of said first potential and said second potential from said input circuit, based on whether or not said fuse resistance is blown out.

10. The method of operating a fuse trimming circuit according to claim 9, wherein a pulling element is configured to be connected to an input terminal of said input circuit, and pull up or down a potential of said input terminal to said first potential.

11. The method of operating a fuse trimming circuit according to claim 10, wherein said trimming pads include:

a first pad configured to be connected to one end of said fuse resistance, and a second pad configured to be connected to another end of said fuse resistance, wherein said current limit units include:

a first resistance configured to be inserted between a first potential input terminal of said input circuit and said first power line, and a second resistance configured to be inserted between the other end of said fuse resistance and a second potential input terminal of said input circuit, and said second power line.

12. The method of operating a fuse trimming circuit according to claim 11, wherein said current limit units further include:

a third resistance configured to be inserted between one end of said fuse resistance and a connection point of said first electrostatic protection element and said second electrostatic protection element.

13. The method of operating a fuse trimming circuit according to claim 10, wherein said fuse trimming circuit further includes:

a pulling element configured to be connected to an input terminal of said input circuit, and pull up or down a potential of said input terminal to said first potential, wherein said trimming pads include:

a first pad configured to be connected to one end of said fuse resistance, and a second pad configured to be connected to another end of said fuse resistance, said fuse trimming circuit further comprising:

a switch element configured to be inserted between said first pad and one end of said fuse resistance.

14. The method of operating a fuse trimming circuit according to claim 13, wherein said current limit units include:

a first resistance configured to be inserted between a first potential input terminal of said input circuit and said first power line, and a second resistance configured to be inserted between the other end of said fuse resistance and a second potential input terminal of said input circuit, and said second power line.

15. The method of operating a fuse trimming circuit according to claim 13, wherein said switch element is not connected to said first power line at one end where said first pad is connected, wherein said current limit units include:

a second resistance configured to be inserted between the other end of said fuse resistance and a second potential input terminal of said input circuit, and said second power line, and a third resistance configured to be connected between one end of said fuse resistance and one end of said pulling element where said input terminal is connected.

16. The fuse trimming circuit according to claim 1, wherein another one of said current limit units is provided between said second potential input terminal and said second power line.

17. The fuse trimming circuit according to claim 1, wherein said first power line is a ground line.

18. The fuse trimming circuit according to claim 1, wherein said second power line is a power line.

19. The fuse trimming circuit according to claim 1, further comprising:

a pulling element configured to be connected to an input terminal of said input circuit, and pull up or down a potential of said input terminal to said first potential.

20. The fuse trimming circuit according to claim 1, wherein a value of at least one of said current limit units is determined by a trimming current of said fuse resistance.

* * * * *